United States Patent
Wang et al.

(10) Patent No.: US 10,643,513 B2
(45) Date of Patent: May 5, 2020

(54) ARRAY SUBSTRATE, DISPLAY PANEL AND TEST METHOD THEREOF AND DISPLAY DEVICE

(71) Applicants: BOE Technology Group Co., Ltd., Beijing (CN); Hefei BOE Optoelectronics Technology Co., Ltd., Hefei (CN)

(72) Inventors: Xiang Wang, Beijing (CN); Wei Xu, Beijing (CN); Yu e Ke, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 158 days.

(21) Appl. No.: 15/804,152

(22) Filed: Nov. 6, 2017

(65) Prior Publication Data
US 2018/0286296 A1  Oct. 4, 2018

(30) Foreign Application Priority Data
Mar. 30, 2017 (CN) .......................... 2017 1 0202709

(51) Int. Cl.
*G01R 31/26* (2020.01)
*G09G 3/00* (2006.01)
*G01R 31/28* (2006.01)

(52) U.S. Cl.
CPC ......... *G09G 3/006* (2013.01); *G01R 31/2884* (2013.01); *G09G 2310/0264* (2013.01); *G09G 2330/12* (2013.01)

(58) Field of Classification Search
CPC .. G01R 31/2884; G09G 3/006; G09G 3/3607; G09G 3/3614
See application file for complete search history.

(56) References Cited

U.S. PATENT DOCUMENTS

| 7,245,342 B2 * | 7/2007 | Shin ................... G02F 1/136286 349/123 |
| 2014/0300852 A1 * | 10/2014 | Yoshida ................ G02F 1/1339 349/143 |
| 2015/0325159 A1 * | 11/2015 | Li ...................... G02F 1/136286 702/117 |
| 2018/0108314 A1 | 4/2018 | Cao et al. |

FOREIGN PATENT DOCUMENTS

| CN | 101556382 A | 10/2009 |
| CN | 105810695 A | 7/2016 |
| CN | 106444189 A | 2/2017 |

OTHER PUBLICATIONS

Dec. 12, 2018—(CN) Office Action application 201710202709.3 with English Translation.

* cited by examiner

*Primary Examiner* — Minh N Tang
(74) *Attorney, Agent, or Firm* — Banner & Witcoff, Ltd.

(57) ABSTRACT

An array substrate, a display panel and a test method thereof and a display device. The array substrate has a display region and a peripheral region and includes a first electrode layer and a first test line. The first electrode layer includes a plurality of first signal lines arranged along a first direction, and the first signal lines extend from the peripheral region to the display region; the first test line is provided in the peripheral region, and extends along the first direction; the first test line is overlapped with and insulated from the first signal lines.

19 Claims, 13 Drawing Sheets ered the disclosure relates to an array

ARRAY SUBSTRATE, DISPLAY PANEL AND TEST METHOD THEREOF AND DISPLAY DEVICE

This application claims priority to and the benefit of Chinese Patent Application No. 201710202709.3 filed on Mar. 30, 2017, which application is incorporated herein in its entirety.

Embodiments of the present disclosure relate to an array substrate, a display panel and a test method thereof and a display device.

BACKGROUND

With continuous development of consumer electronics, display panels have been used widely. The display panel can comprise an array substrate body and a drive circuit, and the drive circuit drives the array substrate body via signal lines to realize display functions. In order to ensure product quality of the display panels and display devices including the display panel, before the display panels/the display devices being shipped, corresponding batches need to be tested. In a case that defects (for example, a column of pixels of the display panel cannot emit light or the emitted light of the column of pixels have a low brightness) exist in the display panel/the display device, whether or not defects exist in the array substrate body and/or the drive circuit need to be further confirmed.

SUMMARY

An embodiment of the present disclosure provides an array substrate, and the array substrate has a display region and a peripheral region, the array substrate comprises a first electrode layer including a plurality of first signal lines arranged along a first direction and a first test line provided in the peripheral region and extending along the first direction; the first signal lines extend from the peripheral region to the display region; the first test line is overlapped with and insulated from the first signal lines.

For example, in the array substrate provided by an embodiment of the present disclosure, the array substrate further comprises a second electrode layer in a different layer from the first electrode layer and including a plurality of second signal lines arranged along the first direction; the plurality of second signal lines extend from the peripheral region to the display region and arranged alternately with the plurality of first signal lines; the first test line is overlapped with and insulated from the second signal lines.

For example, in the array substrate provided by an embodiment of the present disclosure, the first test line comprises a first test electrode provided between two adjacent first signal lines and insulated from the first signal lines, and a second test electrode provided between two adjacent second signal lines and insulated from the second signal lines; the first test electrode and the second test electrode are electrically connected to each other to form the first test line.

For example, in the array substrate provided by an embodiment of the present disclosure, the array substrate further comprises a first insulation layer provided between the first electrode layer and the second electrode layer; the first test electrode and the second test electrode are electrically connected to each other through a via hole in the first insulation layer, to form the first test line.

For example, in the array substrate provided by an embodiment of the present disclosure, the array substrate further comprises a thin film transistor; the thin film transistor comprises a gate, a gate insulation layer, a source and a drain; the first electrode layer is in a same layer as the gate; the first insulation layer is in a same layer as the gate insulation layer; the second electrode layer is in a same layer as the source and the drain.

For example, in the array substrate provided by an embodiment of the present disclosure, at least one end of the first test line is provided with a test terminal.

For example, in the array substrate provided by an embodiment of the present disclosure, the array substrate further comprises a second test line provided in the peripheral region and extending along the first direction; the second test line is overlapped with and insulated from the first signal lines.

For example, in the array substrate provided by an embodiment of the present disclosure, the second test line comprises: a third test electrode provided between two adjacent first signal lines and insulated from the first signal lines and the first test electrode; and a fourth test electrode provided between two adjacent second signal lines and insulated from the second signal lines and the second test electrode. The third test electrode and the fourth test electrode are electrically connected to each other, to form the second test line.

For example, in the array substrate provided by an embodiment of the present disclosure, at least one end of the second test line is provided with a test terminal.

Another embodiment of the present disclosure provides a display panel; the display panel comprises any one of the above-mentioned array substrates and at least one drive circuit. The at least one drive circuit is electrically connected to a plurality of signal lines of the array substrate and drives the array substrate via the plurality of signal lines.

Further another embodiment of the present disclosure provides a display device, which comprises any one of the above-mentioned the display panels.

Still another embodiment of the present disclosure provides a test method of the display panel provided by any one of the above-mentioned embodiments; the test method comprises: selecting a signal line of the display panel as a signal line to be detected; short-circuiting the signal line to be detected with the first test line at a position where the signal line to be detected is overlapped with the first test line, and forming a first short-circuit point; cutting off the signal line to be detected at a side of the first test line far away from the at least one drive circuit; and obtaining an electrical signal to be analyzed that is outputted from a portion of the at least one drive circuit corresponding to the signal line to be detected, via the first test line and the first short-circuit point, and determining whether or not a defect exists in the portion of the at least one drive circuit corresponding to the signal line to be detected.

For example, in the test method provided by still another embodiment of the present disclosure, the test method further comprises: short-circuiting the signal line to be detected with the second test line at a position where the signal line to be detected is overlapped with the second test line, and forming a second short-circuit point; and inputting a first signal into the signal line to be detected via the second test line and the second short-circuit point, and determining whether or not the defect exists in a portion of a display panel body corresponding to the signal line to be detected.

For example, in the test method provided by still another embodiment of the present disclosure, the test method further comprises: selecting a signal line corresponding to a normal display area of the display region of the display panel as a reference signal line; short-circuiting the reference signal line with the first test line at a position where the reference signal line is overlapped with the first test line, and forming a first reference short-circuit point; cutting off the reference signal line at the side of the first test line far away from the at least one drive circuit; cutting off the first test line at a position between the first short-circuit point and the first reference short-circuit point; obtaining a reference electrical signal outputted from a portion of the at least one drive circuit corresponding to the reference signal line, via the first test line and the first reference short-circuit point, and determining whether or not the defect exists in the portion of the at least one drive circuit corresponding to the signal line to be detected by comparing the electrical signal to be analyzed and the reference electrical signal outputted from the at least one drive circuit.

For example, in the test method provided by still another embodiment of the present disclosure, the test method further comprises: selecting a signal line corresponding to a normal display area of the display region of the display panel as a reference signal line; short-circuiting the reference signal line with the first test line at a position where the reference signal line is overlapped with the first test line, and forming a first reference short-circuit point; cutting off the reference signal line at the side of the first test line far away from the at least one drive circuit; cutting off the first test line at a position between the first short-circuit point and the first reference short-circuit point; obtaining a reference electrical signal outputted from a portion of the at least one drive circuit corresponding to the reference signal line, via the first test line and the first reference short-circuit point, and determining whether or not the defect exists in the portion of the at least one drive circuit corresponding to the signal line to be detected by comparing the electrical signal to be analyzed and the reference electrical signal outputted from the at least one drive circuit.

For example, in the test method provided by still another embodiment of the present disclosure, the test method further comprises: short-circuiting the reference signal line with the second test line at a position where the reference signal line is overlapped with the second test line, and forming a second reference short-circuit point; and inputting a second signal into the reference signal line via the second test line and the second reference short-circuit point, and determining whether or not the defect exists in the portion of the display panel body corresponding to the signal line to be detected by comparing displayed images in display regions of the display panel body corresponding to the signal line to be detected and the reference signal line.

For example, in the test method provided by still another embodiment of the present disclosure, short-circuiting of the signal line to be detected with the first test line is conducted by laser welding of the signal line to be detected and the first test line.

For example, in the test method provided by still another embodiment of the present disclosure, cutting off the signal line to be detected and/or the first test line is conducted by laser cutting.

Still another embodiment of the present disclosure further provides another test method of the display panel provided by any one of the above-mentioned embodiments; the test method comprises: selecting a signal line of the display panel as a signal line to be detected; short-circuiting the signal line to be detected with the first test line at a position where the signal line to be detected is overlapped with the first test line, and forming a first short-circuit point; cutting off the signal line to be detected at a side of the first test line far away from an array substrate body; and inputting a first signal into the signal line to be detected, via the first test line and the first short-circuit point, and determining whether or not a defect exists in a portion of a display panel body corresponding to the signal line to be detected.

For example, in another test method provided by still another embodiment of the present disclosure, the test method further comprises: selecting a signal line corresponding to a normal display area of the display region of the display panel as a reference signal line; short-circuiting the reference signal line with the first test line at a position where the reference signal line is overlapped with the first test line, and forming a first reference short-circuit point; cutting off the reference signal line at the side of the first test line far away from the array substrate body; cutting off the first test line at a position between the first short-circuit point and the first reference short-circuit point; inputting a second signal into the reference signal line, via the first test line and the first reference short-circuit point, and determining whether or not the defect exists in the portion of the display panel body corresponding to the signal line to be detected by comparing displayed images in display regions of the display panel body corresponding to the signal line to be detected and the reference signal line.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

Figure 1:
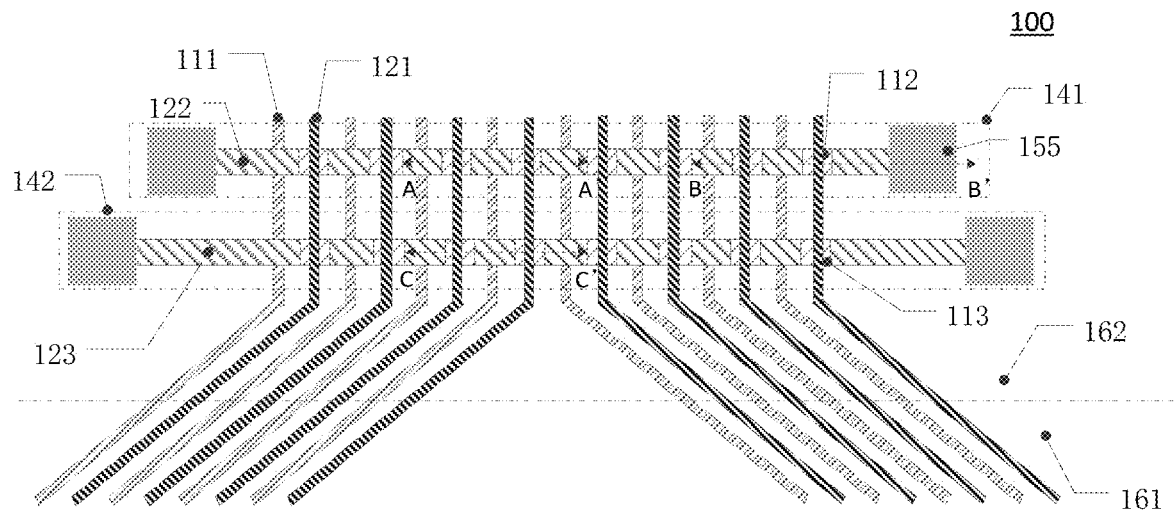
FIG. 1 is a plan view of an array substrate provided by an embodiment of the disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," and the like, which are used in the description and the claims of the present application for disclosure, are not intended to indicate any sequence, amount or importance, but distinguish various components. Also, the terms such as "a," "an," and etc., are not intended to limit the amount, but indicate the existence of at least one. The terms "comprise," "comprising," "include," "including," and the like., are intended to specify that the elements or the objects stated before these terms encompass the elements or the objects and equivalents thereof listed after these terms, but do not preclude the other elements or objects. The phrases "connect", "connected", and the like, are not intended to define a physical connection or mechanical connection, but can include an electrical connection, directly or indirectly. "On," "under," "right," "left" and the like are only used to indicate relative position relationship, and in a case that the position of the object which is described is changed, the relative position relationship may be changed accordingly.

Inventors of the present disclosure have noticed the following contents. At present, in defect tests of display panels, a probe (for example, with 1-2 micrometers in diameter) is stuck into a signal line to be detected (for example, with 4 micrometers in width/diameter) via an insulation layer on the signal line to be detected, so as to obtain an electrical signal outputted from a portion of a drive circuit corresponding to the signal line to be detected (for example, by an oscilloscope). However, testing of the display panels with the above mentioned method can cause the following three problems.

(1) Because widths of the probe and the signal line are small, it is difficult for the probe to stick into the signal line to be detected, and thus testing of the display panel takes a long time.

(2) The probe can break (for example, cut off) the signal line easily, and wrong test result can be obtained. For example, in a case that the signal line to be detected is cut off by the probe, the electrical signal outputted from the portion of the drive circuit corresponding to the signal line to be detected can be zero, so that testers can mistakenly draw a conclusion that the defect exists in the portion of the drive circuit corresponding to the signal line to be detected, thereby accuracy of the display panel tests can be decreased.

(3) Because it is difficult to input a signal into an array substrate body from a signal source outside the display panel, only whether or not the defect exists in the portion of the drive circuit corresponding to the signal line to be detected can be determined, and whether or not the defect exists in a portion of the array substrate body corresponding to the signal line to be detected cannot be determined. For example, in a case that defect exists in the portion of the drive circuit corresponding to the signal line to be detected, the portion of the array substrate body corresponding to the signal line to be detected can still have defect, and thus accuracy of the display panel tests can be reduced.

Therefore, through research, the inventors of the present disclosure propose an array substrate, a display panel and a test method of the display panel, and a display device to improve accuracy and/or efficiency of testing of the display panel and the display device.

Embodiments of the disclosure provide an array substrate, a display panel and test method thereof and a display device. The array substrate, the display panel and the test method thereof and the display device can improve accuracy of testing of the display panel and/or the display device.

At least one embodiment of the disclosure provides an array substrate, and the array substrate has a display region and a peripheral region and comprises a first electrode layer and a first test line. The first electrode layer comprises a plurality of first signal lines arranged along a first direction, and the first signal lines extend from the peripheral region to the display region; the first test line is provided in the peripheral region, and extends along the first direction; the first test line is overlapped with and insulated from the first signal lines. For example, the first test line can be configured to realize defect tests of a display panel including the array substrate through short-circuiting the first test line with at least one first signal line. For example, concrete arrangements of the plurality of first signal lines and the first test line of the array substrate can be determined according to requirements of specific implementations, and no specific limitation will be given here in the embodiment of the present disclosure.

Figure 2A:
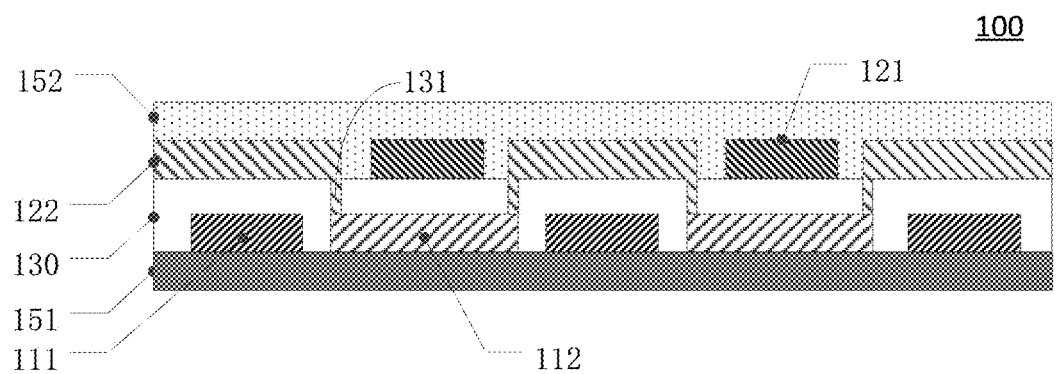
FIG. 2A is a cross-sectional view along line A-A' of the array substrate illustrated in FIG. 1.
Figure 2B:
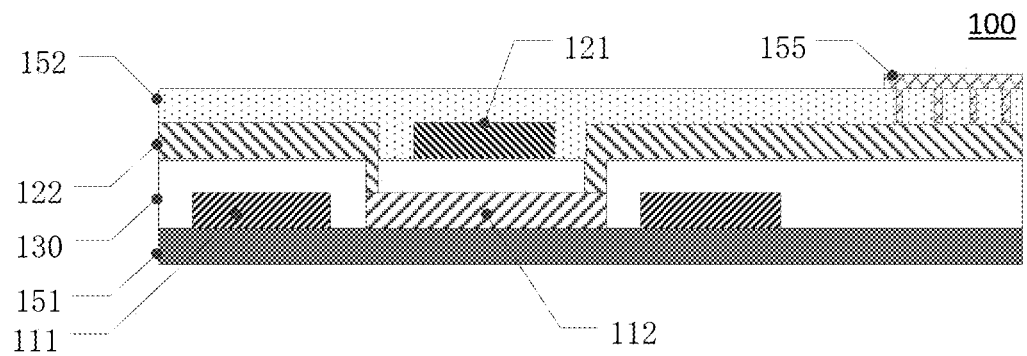
FIG. 2B is a cross-sectional view along line B-B' of the array substrate illustrated in FIG. 1.
Figure 2C:
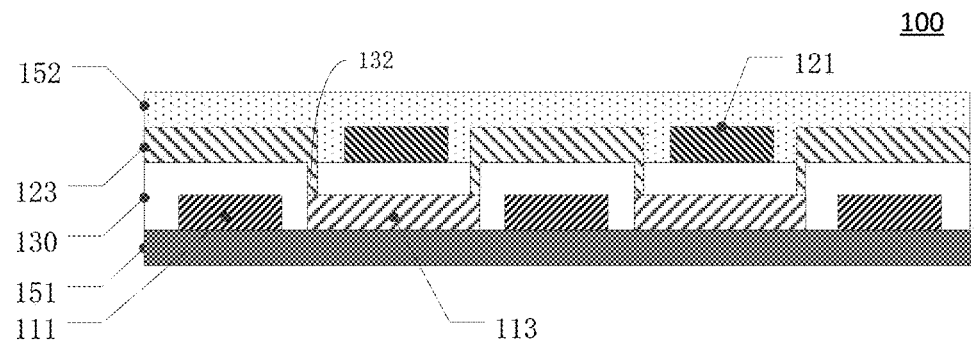
FIG. 2C is a cross-sectional view along line C-C' of the array substrate illustrated in FIG. 1.

For example, FIG. 1 is a plan view of an array substrate 100 provided by an embodiment of the disclosure, and FIGS. 2A, 2B and 2C are cross-sectional views along line A-A', line B-B' and line C-C' of the array substrate 100 as illustrated in FIG. 1, respectively.

For example, as illustrated in FIG. 1, the array substrate 100 has a display region 161 and a peripheral region 162, and the array substrate 100 can comprise a first electrode layer, an insulation layer 130 and a second electrode layer provided on a base substrate in sequence. For example, FIG. 1 only illustrates a portion of the array substrate 100 schematically. For example, the display region 161 can be a middle region of the array substrate 100, and columns of sub-pixels (not illustrated in FIG. 1) are provided in the display region 161 for display operations; for example, each of the sub-pixels can comprise a thin film transistor as a switching element; the peripheral region 162 can be a region located in at least one side of the array substrate 100 (for example, the peripheral region 162 can be a region around the display region 161).

For example, the first electrode layer can comprise a plurality of first signal lines 111 arranged along a first direction (for example, a horizontal direction in FIG. 1), the plurality of first signal lines extend from the peripheral region 162 to the display region 161 of the array substrate 100, to drive corresponding sub-pixels. For example, in a case that the array substrate 100 is a thin film transistor type array substrate, in order to reduce complexity of manufacturing process of the array substrate 100, the first electrode layer can be formed in a same layer as a gate of the thin film transistor.

For example, as illustrated in FIG. 2A, the second electrode layer can comprise a plurality of second signal lines 121 in a different layer from the first electrode layer and arranged along the first direction; the plurality of second signal lines 121 extend from the peripheral region 162 to the display region 161 of the array substrate 100 to drive corresponding sub-pixels; the plurality of second signal lines 121 and the plurality of first signal lines 111 are arranged alternately. For example, an orthographic projection of the plurality of first signal lines 111 on the first electrode layer is not overlapped with an orthographic projection of the plurality of second signal lines 121 on the first electrode layer. For example, in a case that the array substrate 100 is a thin film transistor type array substrate, in order to reduce complexity of manufacturing process of the array substrate 100, the second electrode layer can be formed in a same layer as a source and a drain of the thin film transistor.

For example, as illustrated in FIG. 2A, the first insulation layer 130 can be provided between the first electrode layer and the second electrode layer. For example, in a case that the array substrate 100 is a thin film transistor type array substrate, in order to reduce complexity of manufacturing process of the array substrate 100, the first insulation layer 130 can be formed in a same layer as a gate insulation layer of the thin film transistor.

For example, as illustrated in FIGS. 1 and 2A, the array substrate 100 can further comprises a first test line 141 provided in the peripheral region 162 and extending along the first direction. For example, the first test line 141 can be overlapped with and insulated from the plurality of first signal lines 111 and the plurality of second signal lines 121. For example, the first test line 141 can comprise a first test electrode 112 provided between two adjacent first signal lines and insulated from the first signal lines 111. For example, the first test line 141 can further comprise a second test electrode 122 provided between two adjacent second signal lines 121 and insulated from the second signal lines 121. For example, the orthographic projections of the first test electrode 112 and the second test electrode 122 on the first electrode layer are at least partially overlapped. For example, the first test electrode 112 and the second test electrode 122 are electrically connected to each other (for example, can be electrically connected to each other through a via hole 131 in the first insulation layer 130), thereby forming the first test line 141.

For example, for the array substrate 100 provided by an embodiment of the disclosure, because the first signal line 111 and the second signal line 121 are provided in the first electrode layer and the second electrode layer respectively, density of the signal lines (for example, the first signal lines 111 and the second signal lines 111) can be improved without incurring short circuit (for example, short circuit between the signal lines), and thus an area (or size) of the peripheral region 162 of the array substrate 100 can be reduced.

For example, as illustrated in FIG. 2B, in a case that the second electrode layer is formed in the same layer as the source and the drain of the thin film transistor, the array substrate 100 can further comprise a second insulation layer 152 provided on a side of the second electrode layer far away from the first electrode layer, so as to prevent metal of the second electrode layer from oxidizing.

For example, in order to reduce difficulty of test and to decrease time needed for tests (for example, display panel tests), the array substrate 100 can further comprise a test terminal 155 provided on a side of the second insulation layer 152 far away from the first electrode layer. For example, the test terminal 155 can be electrically connected with the second test electrode 122 of the first test line 141 by at least one via hole in the second insulation layer 152. For example, the test terminal 155 can be electrically connected with the second test electrode(s) 122 at one end or two ends of the first test line 141 by at least one via hole in the second insulation layer 152, but the embodiments of the present disclosure are not limited to the above-mentioned cases. For example, the test terminal 155 can further be electrically connected with a plurality of the second test electrodes 122 (for example, four second test electrodes 122) of the first test line 141.

For example, in order to further reduce difficulty of test and further decrease time needed for tests, a width of the test terminal 155 can be larger than a width of the second test electrode 122. For example, in order to prevent performance degradation of the test terminal 155 caused by oxidizing of the test terminal 155, the test terminal 155 can be made of a transparent and conductive material (for example, ITO).

For example, in a case that the array substrate 100 is a thin film transistor type array substrate, in order to reduce complexity of manufacturing process of the array substrate 100, the second insulation layer 152 can be formed in a same layer as a passivation layer of the array substrate 100 and the test terminal 155 can be formed in a same layer as a common electrode of the array substrate 100.

For example, in order to provide supporting and protection functions, the array substrate 100 can further comprise a base substrate 151. For example, the base substrate 151 can be a glass substrate, a quartz substrate, a plastic substrate [for example, a polyethylene terephthalate (PET)] or a substrate made of other suitable material.

For example, as illustrated in FIGS. 1 and 2C, the array substrate 100 provided by an embodiment of the disclosure can further comprise a second test line 142, the second test line 142 can be provided in a peripheral region 162 and extend along the first direction; the second test line 142 can be overlapped with and insulated from the first signal lines 111 and the second signal lines 121. For example, the second test line 142 can comprise a third test electrode 113 provided between two adjacent first signal lines and insulated from the first signal lines 111 and the first test line 112. For example, the second test line 142 can further comprise a fourth test electrode 123 provided between two adjacent second signal lines 121 and insulated from the second signal lines 121 and the second test line 122. For example, the orthographic projections of the third test electrode 113 and the fourth test electrode 123 on the first electrode layer can be at least partially overlapped. For example, the third test electrode 113 and the fourth test electrode 123 are electrically connected to each other (for example, can be electrically connected to each other by a via hole 132 in the first insulation layer 130), thereby forming the second test line 142.

Figure 3:
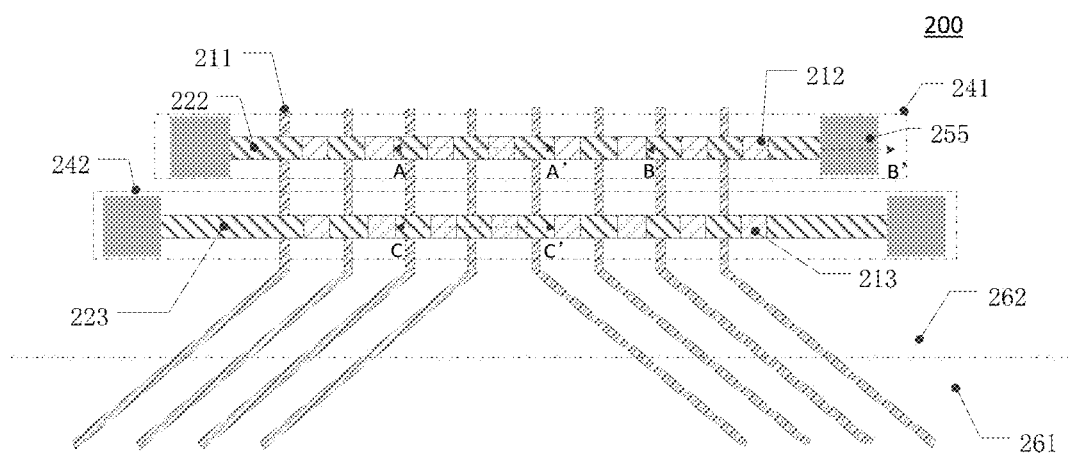
FIG. 3 is a plan view of another array substrate provided by an embodiment of the disclosure.
Figure 4A:
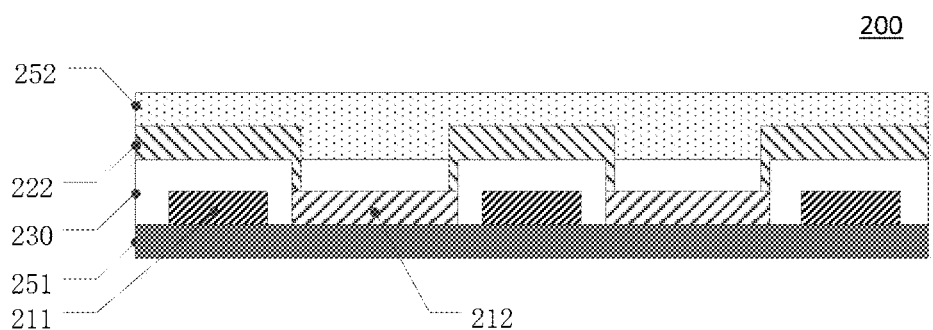
FIG. 4A is a cross-sectional view along line A-A' of the array substrate illustrated in FIG. 3.
Figure 4B:
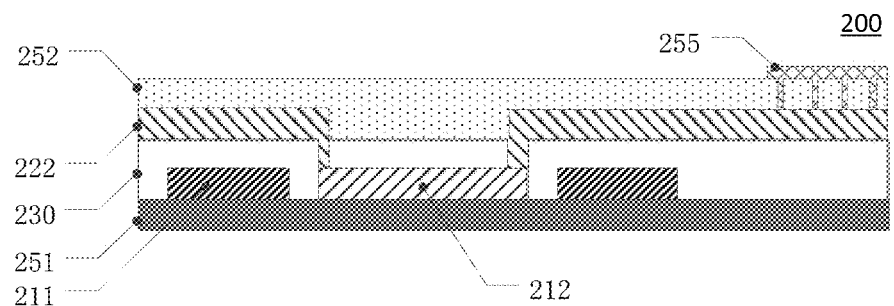
FIG. 4B is a cross-sectional view along line B-B' of the array substrate illustrated in FIG. 3.
Figure 4C:
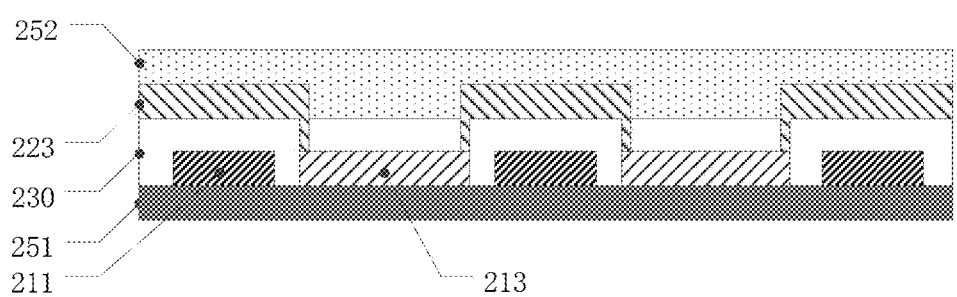
FIG. 4C is a cross-sectional view along line C-C' of the array substrate illustrated in FIG. 3.

For example, a structure of the array substrate provided by an embodiment of the disclosure is not limited to the cases as illustrated in FIGS. 1 and 2A-2C. For example, according to requirements of specific implementations, the array substrate provided by an embodiment of the disclosure can also adopt a structure as illustrated in FIGS. 3 and 4A-4C. For example, FIG. 3 is a plan view of another array substrate 200 provided by an embodiment of the disclosure, and FIGS. 4A, 4B and 4C are cross-sectional views along line A-A', line B-B' and line C-C' of the array substrate 100 as illustrated in FIG. 3, respectively.

For example, as illustrated in FIGS. 3 and 4A, the array substrate 100 has a display region 261 and a peripheral region 262, and the array substrate 100 can comprise a first electrode layer, a second electrode layer and a first insulation layer 230 provided between the first electrode layer and the second electrode layer. For example, the first electrode layer can comprise a plurality of first signal lines 211 arranged along a first direction; for example, the first electrode layer can further comprise a first test electrode 212 provided between two adjacent first signal lines 211 and insulted from the first signal lines 211; the plurality of first signal lines 211 extend from the peripheral region 262 to the display region 261 of the substrate 200. For example, the second electrode layer can comprise a second test electrode 222 provided in the peripheral region 262 and arranged along the first direction. For example, orthogonal projections of the first test electrode 212 and the second test electrode 22 on the first electrode layer can be at least partially overlapped. For example, the first test electrode 212 and the second test electrode 222 can be electrically connected to each other (for example, can be electrically connected to each other by a via hole in the first insulation layer 230), thereby forming the first test line 241 overlapped with and insulated from the first signal line 211.

For example, as illustrated in FIG. 4B, the array substrate 200 can further comprise a second insulation layer 252 provided on a side of the second electrode layer far away from the first electrode layer, and a test terminal 255 provided on a side of the second insulation layer 252 far away from the first electrode layer. For example, the test terminal 255 can be electrically connected to the second test electrode 222 of the first test line 241 by at least one via hole in the second insulation layer 252 (for example, can be electrically connected to the second test electrode(s) 222 at one end or two ends of the first test line 241). For example, in order to provide supporting and protection functions, the array substrate 200 can further comprise a base substrate 251.

For example, as illustrated in FIGS. 3 and 4C, the array substrate 100 provided by an embodiment of the disclosure can further comprise a second test line 242, the second test line 242 can be provided in a peripheral region 262 and extend along the first direction. For example, the second test line 242 can comprise a third test electrode 213 provided between two adjacent first signal lines 211 and insulated from the first signal lines 211 and the first test electrode 212, and a fourth test electrode 223 provided in the second electrode layer and insulated from the second test electrode 222. For example, orthogonal projections of the third test electrode 213 and the fourth test electrode 223 on the first electrode layer can be at least partially overlapped. For example, the third test electrode 213 and the fourth test electrode 223 are electrically connected to each other (for example, can be electrically connected to each other by a via hole in the first insulation layer 230), thereby forming the second test line 242 overlapped with and insulated from the first signal lines 211. For example, a detailed arrangements of another array substrate 200 provided by an embodiment of the disclosure can refer to the embodiments of the array substrate 200 as illustrated in FIGS. 1 and 2, and thus no further descriptions will be given herein.

The first test line and/or the second test line is not limited to be in a form of broken line as illustrated in FIGS. 4A and 4B, in a case illustrated in FIGS. 4A and 4B, a portion of the first test line and/or the second test line is in the first electrode layer and another portion of the first test line and/or the second test line is in the second electrode layer, in a variant of the examples of FIGS. 3, 4A and 4B, the first test line can be a straight line entirely provided in the second electrode layer (for example, the first test line 241 can be parallel to the base substrate 251) and/or the second test line can be a straight line entirely provided in the second electrode layer (for example, the second test line 242 can be parallel to the base substrate 251).

Obviously, the array substrate provided by an embodiment of the disclosure is not limited to the array substrate as illustrated in FIGS. 1-4. For example, compared to the structure of the array substrate as illustrated in FIGS. 1 and 2, the first test line and the second test line of the array substrate as illustrated in FIGS. 3 and 4 can also be provided according to at least the following two methods: (1) the array substrate comprise a second signal line located in the second electrode layer only, but does not comprise the first signal line located in the first electrode layer; and the first test line and/or the second test line can be in a form of a broken line; in such a case, for example, a portion of the first test line and/or the second test line can be provided in the first electrode layer and another portion of the first test line and/or the second test line can be provided in the second electrode layer; (2) the first test line and/or the second test line can also be a straight line entirely provided in the first electrode layer; apparently, the embodiments of the disclosure is not limited to the above-mentioned cases. For example, the array substrate provided by an embodiment of the disclosure can improve accuracy and efficiency of testing of the display panel and/or the display device including any one of the above-mentioned array substrates. Concrete reasons will be detailed described in a test method of display panel provided by still another embodiment of the disclosure.

At least one embodiment of the disclosure provides a display panel, and the display panel comprises any one of the above-mentioned array substrates provided by an embodiment of the disclosure and at least one drive circuit. Each drive circuit is electrically connected to a plurality of signal lines of the array substrate, and drives the array substrate by the plurality of signal lines.

Figure 5A:
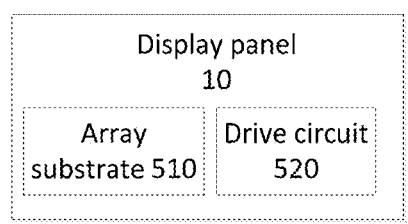
FIG. 5A is an exemplary block diagram of a display panel provided by another embodiment of the disclosure.
Figure 5B:
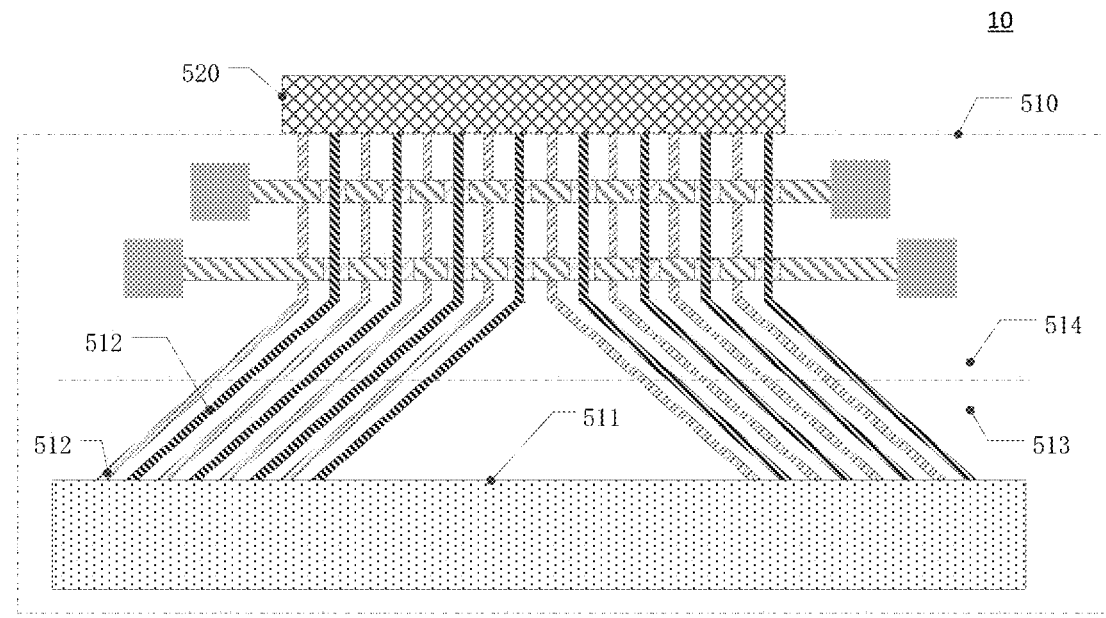
FIG. 5B is a plan view of the display panel illustrated in FIG. 5A.

For example, FIG. 5A is an exemplary block diagram of a display panel 10 provided by another embodiment of the disclosure, and FIG. 5B is a plan view of the display panel 10 as illustrated in FIG. 5A. For example, taking the array substrate illustrated in FIGS. 1 and 2 as an example, as illustrated in FIGS. 5A and 5B, the display panel 10 can comprise an array substrate 510 and at least one drive circuit 520. For example, ends, which are located in the peripheral region 514, of the plurality of signal lines 512 of the array substrate 510 can be electrically connected to the drive circuit 520; ends, which are located in the display region 513, of the plurality of signal lines 512 of the array substrate 510 can be electrically connected to the array substrate body 511, and each drive circuit 520 can drive corresponding sub-pixels provided in the array substrate body 511 by the plurality of signal lines 512.

For example, the display panel 10 can comprise two drive circuits 520, one drive circuit 520 is electrically connected to gate lines of the array substrate body 511 (not illustrated in FIG. 5B) by the plurality of signal lines 512, another drive circuit 520 is electrically connected to data lines of the array substrate body 511 (not illustrated in FIG. 5B) by the plurality of data lines 512, but the embodiments of the disclosure are not limited to a case that the display panel 10 comprises two drive circuits. For example, according to requirements of specific implementations, the display panel can also comprise four drive circuits or one drive circuit.

Figure 6:
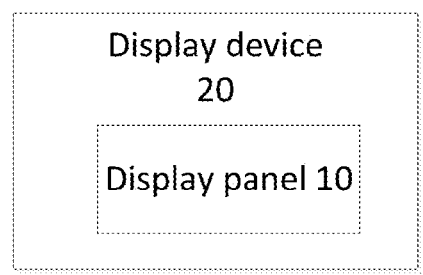
FIG. 6 is an exemplary block diagram of a display device provided by further another embodiment of the disclosure.

For example, FIG. 6 is a schematic diagram of a display device provided by further another embodiment of the disclosure. The display device 20 comprises any one of the above-mentioned display panel provided by the embodiments of the disclosure. It should be noted that, those skilled in related arts should appreciate that other essential parts of the display device 20 can adopt conventional components suitable to specific implementations; no further descriptions will be given herein, and thus are not limitative of the disclosure.

At least one embodiment of the disclosure provides a test method of a display panel for any one of above mentioned display panels, and the test method comprises: selecting a signal line corresponding to an abnormal display area of the display region of a display panel as a signal line to be detected; short-circuiting the signal line to be detected with the first test line at a position where the signal line to be detected is overlapped with the first test line, and forming a first short-circuit point; cutting off the signal line to be detected at a side of the first test line far away from a drive circuit/an array substrate body; and obtaining an electrical signal to be analyzed that is outputted from the drive circuit/inputting a first signal into the signal line to be detected, via the first test line and the first short-circuit point, and determining whether or not a defect exists in a portion of the drive circuit/a portion of a display panel body corresponding to the signal line to be detected.

In the following, a test method of a display panel provided by still another embodiment of the disclosure is described in detail with the display panel including the array substrate as illustrated in FIGS. 1 and 2 being taken as an example, but the test method of the display panel provided by still another embodiment of the disclosure is not limited to testing of the array substrate as illustrated in FIGS. 1 and 2. For example, the above mentioned test method can also be used in testing of the array substrate as illustrated in FIGS. 3 and 4 and the array substrates provided by other examples.

Figure 7A:
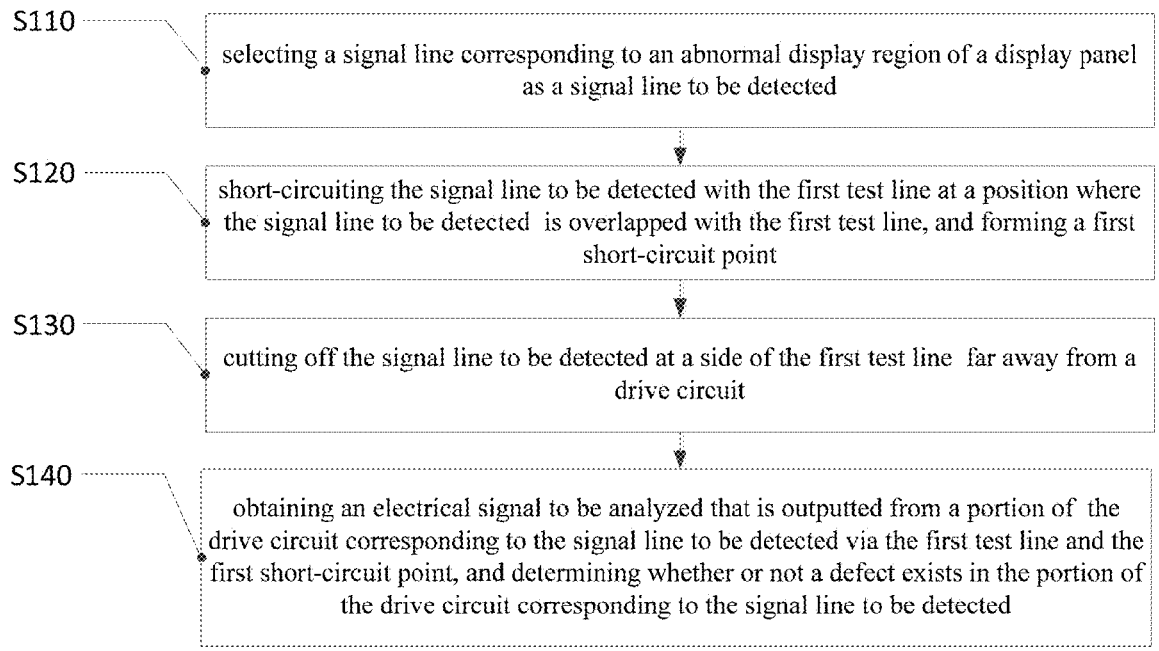
FIG. 7A is an exemplary flow chart of a test method of a display panel provided by still another embodiment of the disclosure.
Figure 7B:
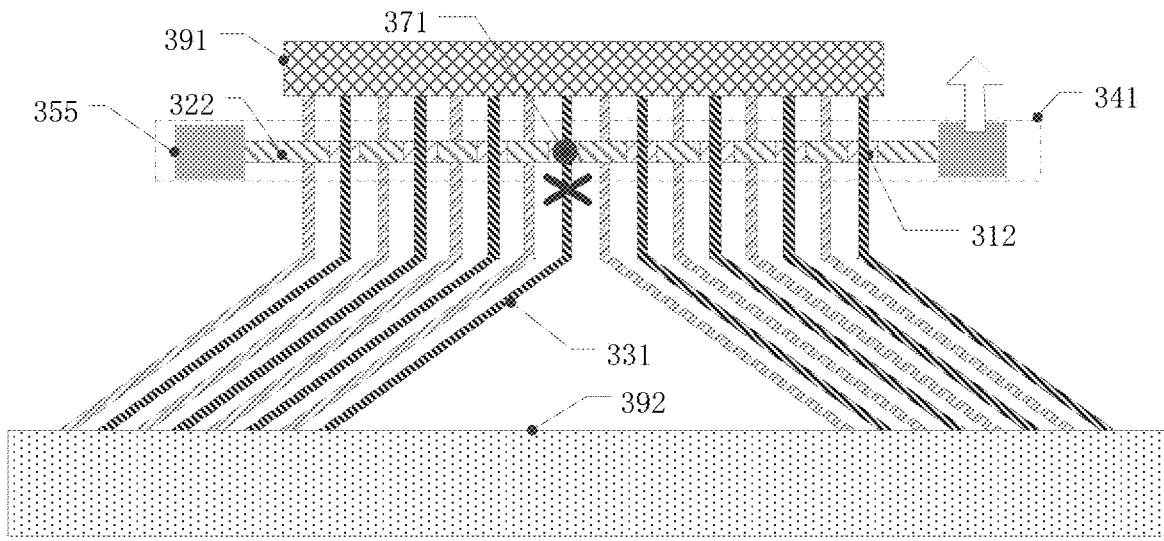
FIG. 7B is a schematic diagram of the test method illustrated in FIG. 7A.

For example, FIG. 7A is an exemplary flow chart of a test method of a display panel provided by still another embodiment of the disclosure, and FIG. 7B is a schematic diagram of the test method as illustrated in FIG. 7A. As illustrated in FIGS. 7A and 7B, the test method of the display panel (for example, the test method for determining defects of the display panel) can comprise the following steps:

Step S110: selecting a signal line corresponding to an abnormal display area of the display region of a display panel as a signal line to be detected 331;

Step S120: short-circuiting the signal line to be detected 331 with the first test line 341 at a position where the signal line to be detected 331 is overlapped with the first test line 341, and forming a first short-circuit point 371;

Step S130: cutting off the signal line to be detected 331 at a side of the first test line 341 far away from a drive circuit 391; and Step S140: obtaining an electrical signal to be analyzed that is outputted from a portion of the drive circuit 391 corresponding to the signal line to be detected 331 via the first test line 341 and the first short-circuit point 371, and determining whether or not a defect exists in the portion of the drive circuit 391 corresponding to the signal line to be detected 331.

For example, in the step S110, in a case that defects (for example, a dark line or a dark spot) exist in the display region of the display panel, a signal line corresponding to a defect region (i.e., an abnormal display area) of the display region can be selected as the signal line to be detected 331. For example, the signal line to be detected 331 can be a first signal line; for another example, the signal line to be detected 331 can also be a second signal line, and no specific limitation will be given here in the embodiment of the present disclosure.

For example, in the step S120, short-circuiting of the signal line to be detected 331 with the first test line 341 can be conducted by laser welding of the signal line to be detected 331 and the first test line 341 at a position where the signal line to be detected 331 is overlapped with the first test line 341. For example, in a case that the signal line to be detected 331 is the first signal line, the first signal line and a corresponding second test electrode 322 overlapped with the first signal line can be welded together by laser, such that a short-circuit between the first signal line and the first test line 341 can be realized. For another example, in a case that the signal line to be detected 331 is the second signal line, the second signal line and a corresponding first test electrode 312 overlapped with the second signal line can be welded together by laser, such that a short-circuit between the second signal line and the first test line 341 can be realized.

For example, in the step S130 and step S140, the signal line to be detected 331 can be cut off at a side of the first test line 341 far away from the drive circuit 391 (for example, the signal line to be detected 331 can be cut off by laser), and then an electrical signal to be analyzed that is outputted from a portion of the drive circuit 391 corresponding to the signal line to be detected 331 can be obtained via the first test line 341 and the first short-circuit point 371, thereby whether or not a defect exists in the portion of the drive circuit 391 corresponding to the signal line to be detected 331 can be determined. For example, according to requirements of specific implementations, the electrical signal to be analyzed that is outputted from the drive circuit 391 can be obtained by a test terminal at a right end of the first test line 341 or by a second test electrode 322 of the first test line 341 as illustrated in FIG. 7B, and no specific limitation will be given here in the embodiment of the present disclosure. For example, in a case that the electrical signal to be analyzed, which is outputted from the drive circuit 391 and obtained by a test terminal 355 of the first test line 341 and the first short-circuit point, is an unexpected electrical signal (for example, no electrical signal is outputted from the drive circuit 391, or an intensity of the electrical signal is too low), it can be determined that the defect exists in the portion of the drive circuit 391 corresponding to the signal line to be detected 331.

Figure 8A:
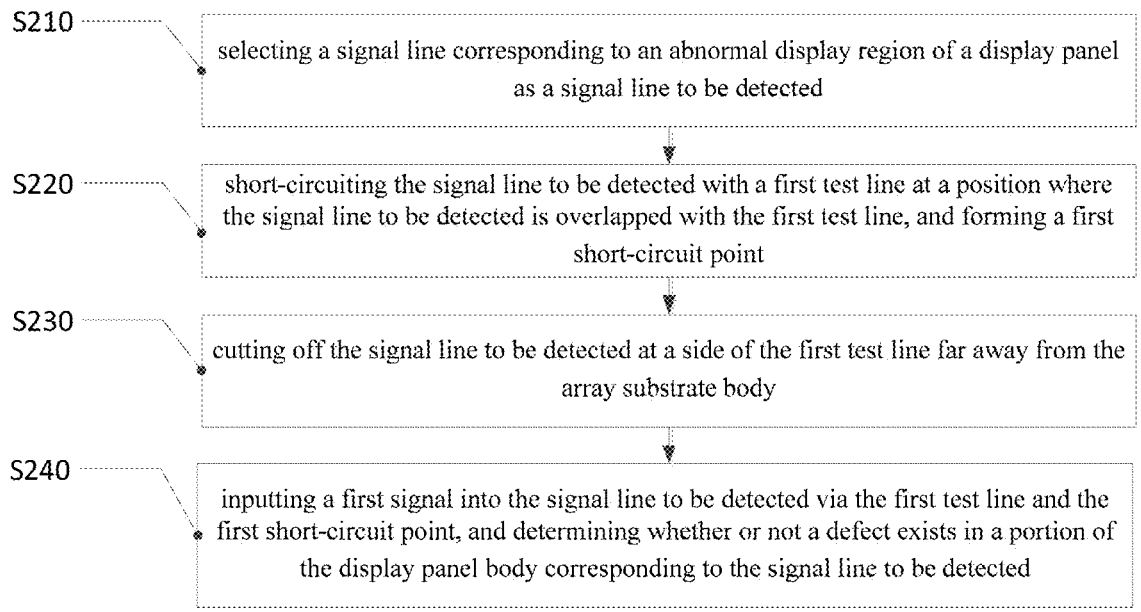
FIG. 8A is an exemplary flow chart of another test method of a display panel provided by still another embodiment of the disclosure.
Figure 8B:
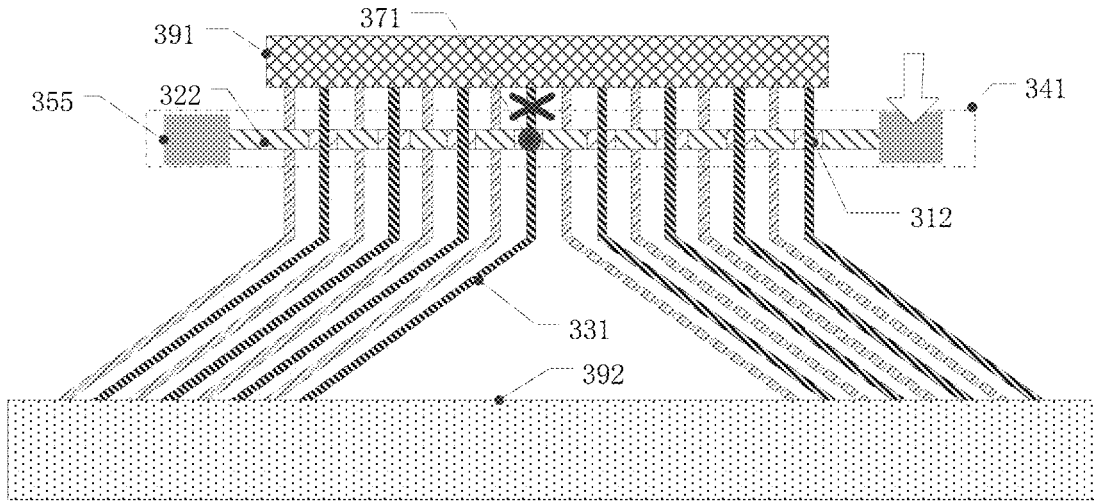
FIG. 8B is a schematic diagram of the test method illustrated in FIG. 8A.

For example, FIG. 8A is an exemplary flow chart of another test method of a display panel provided by still another embodiment of the disclosure, and FIG. 8B is a schematic diagram of the test method as illustrated in FIG.

8A. For example, as illustrated in FIGS. 8A and 8B, the test method of the display panel can comprise the following steps:

Step S210: selecting a signal line corresponding to an abnormal display area of the display region of a display panel as a signal line to be detected 331;

Step S220: short-circuiting the signal line to be detected 331 with a first test line 341 at a position where the signal line to be detected 331 is overlapped with the first test line 341, and forming a first short-circuit point 371;

Step S230: cutting off the signal line to be detected 331 at a side of the first test line 341 far away from the array substrate body 392; and Step S240: inputting a first signal into the signal line to be detected 331 via the first test line 341 and the first short-circuit point 371, and determining whether or not a defect exists in a portion of the display panel body corresponding to the signal line to be detected 331.

For example, detailed implementation methods of the steps S210 and S220 can refer to the steps S110 and S120. For example, in the steps S230 and S240, the signal line to be detected 331 can be cut off (for example, the signal line to be detected 331 can be cut off by laser) at the side of the first test line 341 far away from the display panel body (i.e. a portion of the display panel including the array substrate body 392) or far away from the array substrate body 392; and then the first signal can be inputted into the signal line to be detected 331 via the first test line 341 (for example, a test terminal 355 at a right end of the first test line 341) and the first short-circuit point 371, thereby whether or not the defect exists in the portion of the display panel body corresponding to the signal line to be detected 331 can be determined. For example, in a case that the portion of the display panel corresponding to the signal line to be detected 331 still cannot display normally (for example, corresponding pixels cannot emit light or the emitted light of the corresponding pixels have a low brightness) after the first signal being inputted into the signal line to be detected 331 via the test terminal 355 at the right side of the first test line 341 and the first short-circuit point 371, it can be determined that the defect exists in the portion of the display panel corresponding to the signal line to be detected 331.

For example, for the test method of the display panel as illustrated in FIGS. 7 and 8, the signal line to be detected 331 can be short-circuited with the first test line 341 at a position where the signal line to be detected 331 is overlapped with the first test line 341, and thus an electrical signal outputted from the drive circuit 391 can be obtained/a first signal can be inputted into the signal line to be detected 331, via the first test line 341 and the first short-circuit point 371, and whether or not the defect exists in the portion of the drive circuit 391/the display panel body corresponding to the signal line to be detected 331 can be determined. Whether or not a defect exists in the drive circuit 391 or the display panel body can be directly determined by the test method of the display panel as illustrated in FIGS. 7 and 8, and thus accuracy of display panel tests can be improved. In addition, because the electrical signal to be analyzed that is outputted from the drive circuit 391 can be obtained/the first signal can be inputted into the signal line to be detected by the test terminal 355 (i.e. it is not necessary to stick a test probe into the signal line), not only difficulty of test can be reduced but also broken signal line (for example, cutting off by the test probe) can be avoided. Therefore, time needed by the display panel tests can be reduced and accuracy of the display panel tests can be further improved.

Figure 9A:
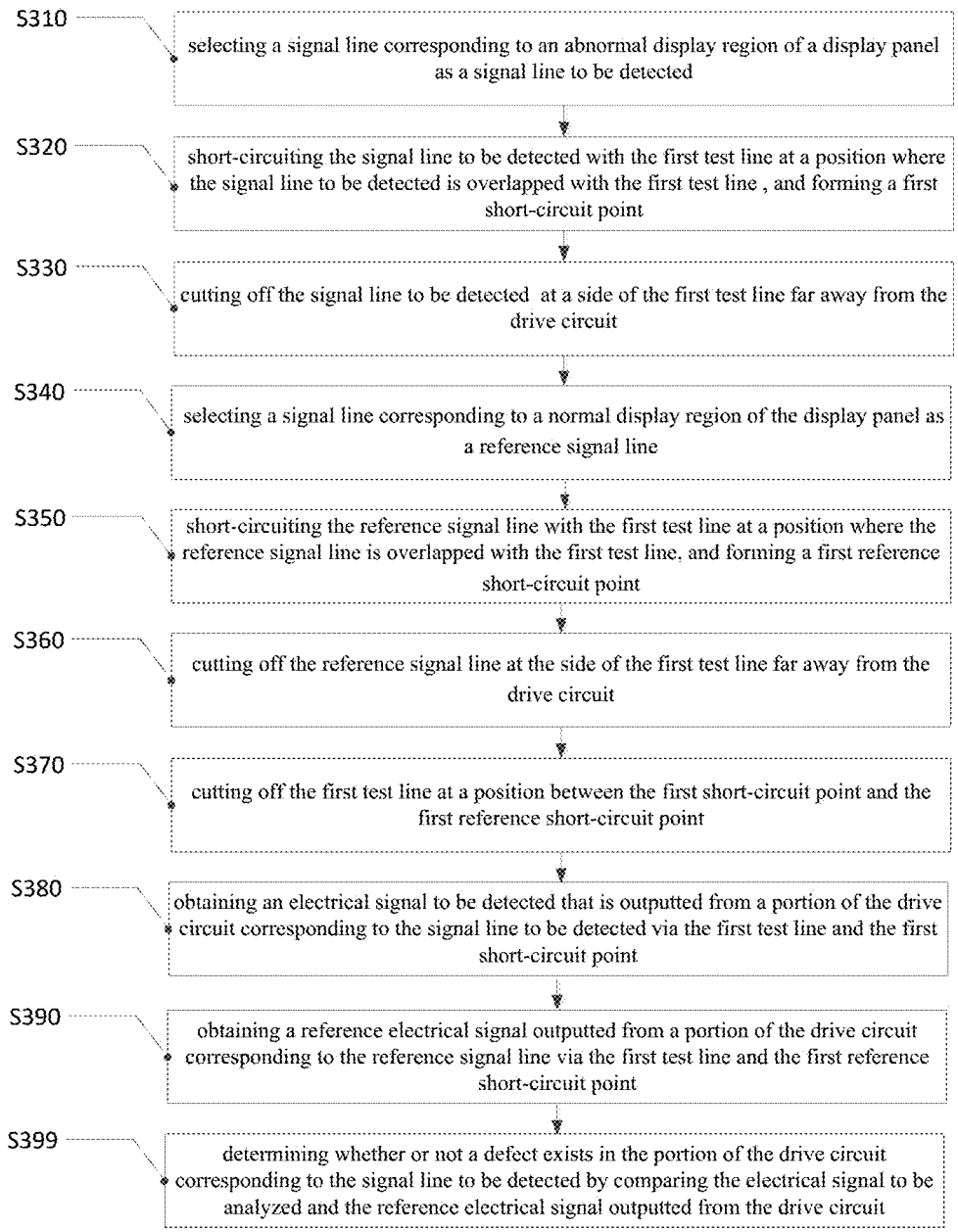
FIG. 9A is an exemplary flow chart of further another test method of a display panel provided by still another embodiment of the disclosure.
Figure 9B:
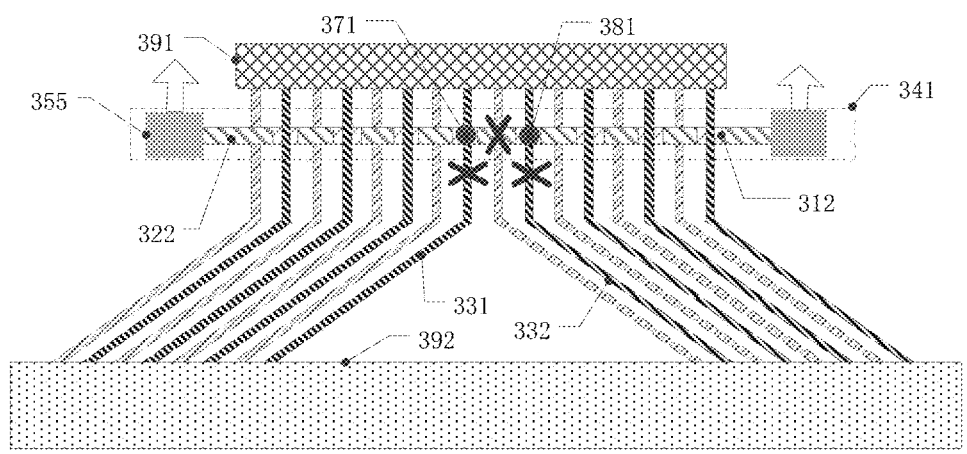
FIG. 9B is a schematic diagram of the test method illustrated in FIG. 9A.

For example, FIG. 9A is an exemplary flow chart of further another test method of a display panel provided by still another disclosure, and FIG. 9B is a schematic diagram of the test method as illustrated in FIG. 9A. As illustrated in FIGS. 9A and 9B, the test method of the display panel can comprises the following steps:

Step S310: selecting a signal line corresponding to an abnormal display area of the display region of a display panel as a signal line to be detected 331;

Step S320: short-circuiting the signal line to be detected 331 with the first test line 341 at a position where the signal line to be detected 331 is overlapped with the first test line 341, and forming a first short-circuit point 371;

Step S330: cutting off the signal line to be detected 331 at a side of the first test line 341 far away from the drive circuit 391;

Step S340: selecting a signal line corresponding to a normal display area of the display region of the display panel as a reference signal line 332;

Step S350: short-circuiting the reference signal line 332 with the first test line 341 at a position where the reference signal line 332 is overlapped with the first test line 341, and forming a first reference short-circuit point 381;

Step S360: cutting off the reference signal line 332 at the side of the first test line 341 far away from the drive circuit 391;

Step S370: cutting off the first test line 341 at a position between the first short-circuit point 371 and the first reference short-circuit point 381;

Step S380: obtaining an electrical signal to be analyzed that is outputted from a portion of the drive circuit 391 corresponding to the signal line to be detected 331 via the first test line 341 and the first short-circuit point 371;

Step S390: obtaining a reference electrical signal outputted from a portion of the drive circuit 391 corresponding to the reference signal line 332 via the first test line 341 and the first reference short-circuit point 381; and Step S399: determining whether or not a defect exists in the portion of the drive circuit 391 corresponding to the signal line to be detected 331 by comparing the electrical signal to be analyzed and the reference electrical signal outputted from the drive circuit 391.

For example, detailed implementation methods of the step S310-the step S360 can refer to the step S110 to the step S130, and thus no further descriptions will be given herein. For example, in the step S340, expected image can be displayed by the normal display area of the display region of the display pane; for example, each pixel in the normal display area of the display region can emit light with expected brightness.

For example, in the step S370, the first test line 341 can be cut off by laser; for example, a second test electrode 322 between the first short-circuit point 371 and the first reference short-circuit point 381 can be disconnected (for example, electrically disconnected) in the first direction by laser. For example, in the step S380 and the step S390, the electrical signal to be analyzed that is outputted from the portion of the drive circuit 391 corresponding to the signal line to be detected 331 can be obtained by a test terminal 355 at a left end of the first test line 341 and the first short-circuit point 371, and the reference electrical signal outputted from the portion of the drive circuit 391 corresponding to the reference signal line 332 can be obtained by a test terminal 355 at a right end of the first test line 341 and the first reference short-circuit point 381. For example, in the step S399, whether or not the defect exists in the portion of the drive circuit 391 corresponding to the signal line to be detected 331 can be determined by comparing intensities, wave forms or timing sequences of the electrical signal to be analyzed and the reference electrical signal. Thus, accuracy of display panel tests can be further increased. Obviously, the sequence of the above-mentioned steps of the test method of the display panel as illustrated in FIG. 9A is only an example, and the sequence of the above-mentioned steps can be changed by requirements of specific implementations. For another example, the steps of the test method of the display panel as illustrated in FIG. 9A can be performed according to the following sequence: step S310, step S340, step S320, step S350, step S330 and step S360-step S399.

Figure 10A:
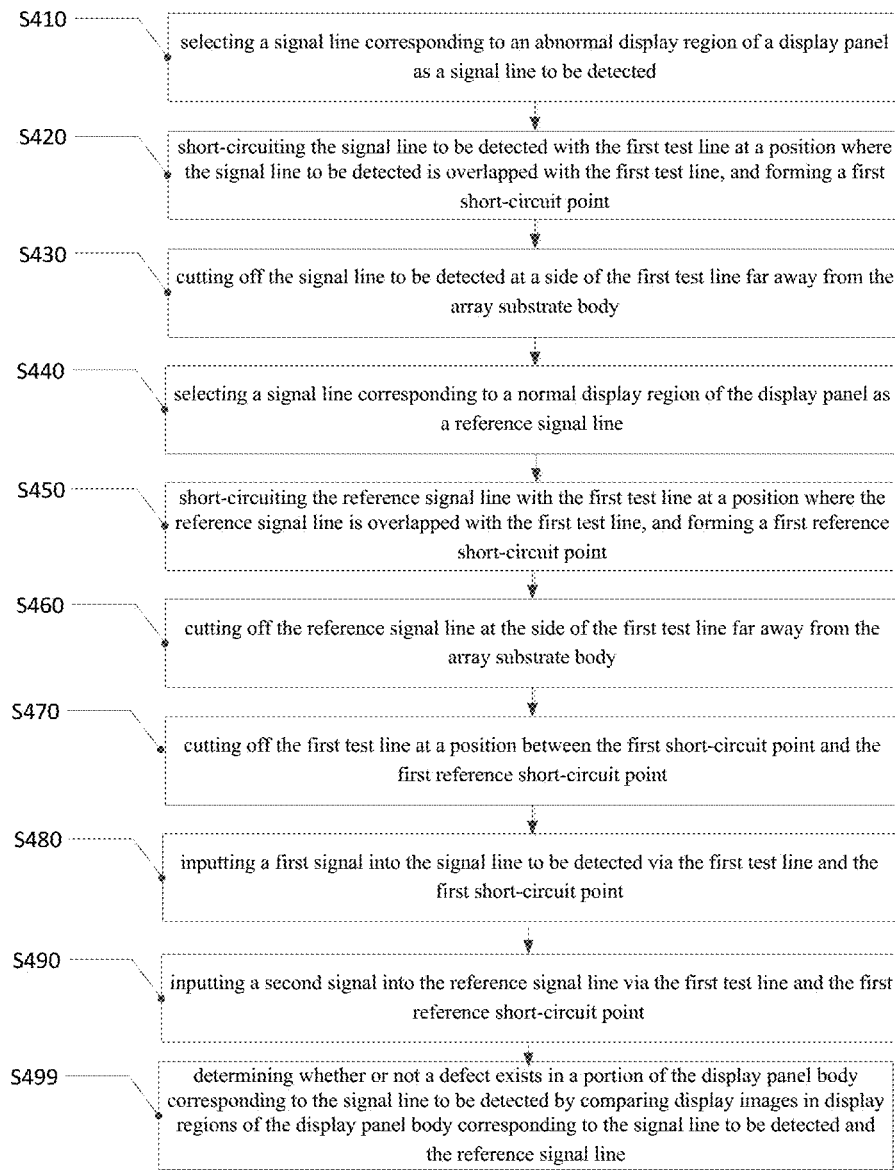
FIG. 10A is an exemplary flow chart of still another test method of a display panel provided by still another embodiment of the disclosure.
Figure 10B:
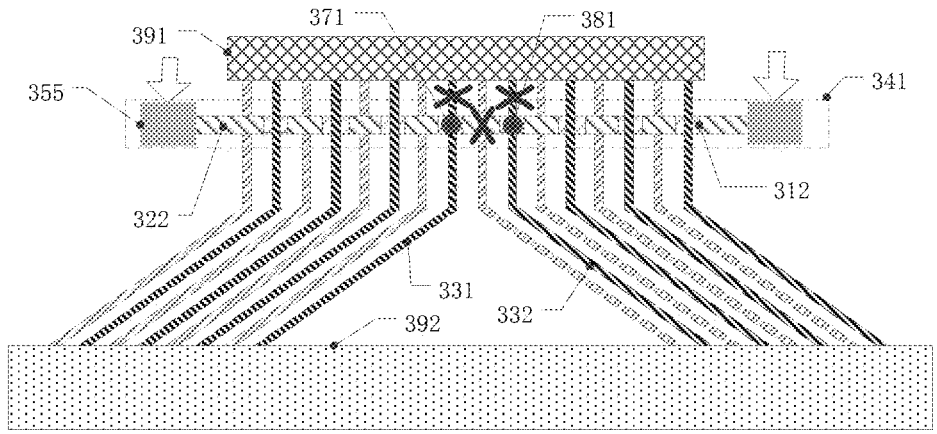
FIG. 10B is a schematic diagram of the test method illustrated in FIG. 10A.

For example, FIG. 10A is an exemplary flow chart of still another test method of a display panel provided by still another disclosure, and FIG. 10B is a schematic diagram of the test method as illustrated in FIG. 10A. As illustrated in FIGS. 10A and 10B, the test method of the display panel can comprises the following steps:

Step S410: selecting a signal line corresponding to an abnormal display area of the display region of a display panel as a signal line to be detected 331;

Step 420: short-circuiting the signal line to be detected 331 with the first test line 341 at a position where the signal line to be detected 331 is overlapped with the first test line 341, and forming a first short-circuit point 371;

Step S430: cutting off the signal line to be detected 331 at a side of the first test line 341 far away from the array substrate body 392;

Step S440: selecting a signal line corresponding to a normal display area of the display region of the display panel as a reference signal line 332;

Step S450: short-circuiting the reference signal line 332 with the first test line 341 at a position where the reference signal line 332 is overlapped with the first test line 341, and forming a first reference short-circuit point 381;

Step S460: cutting off the reference signal line 332 at the side of the first test line 341 far away from the array substrate body 392;

Step S470: cutting off the first test line 341 at a position between the first short-circuit point 371 and the first reference short-circuit point 381;

Step S480: inputting a first signal into the signal line to be detected 331 via the first test line 341 and the first short-circuit point 371;

Step S490: inputting a second signal into the reference signal line 332 via the first test line 341 and the first reference short-circuit point 381; and Step S499: determining whether or not a defect exists in a portion of the display panel body corresponding to the signal line to be detected 331 by comparing displayed images in display regions of the display panel body corresponding to the signal line to be detected 331 and the reference signal line 332.

For example, detailed implementation methods of the step S410-the step S470 can refer to the step S310 to the step S370, and thus no further descriptions will be given herein. For example, in the step S480 and the step S490, signals with same intensity, waveform and timing sequence can be inputted into the signal line to be detected 331 and the reference signal line 332 respectively, and whether or not a defect exists in the portion of the display panel body corresponding to the signal line to be detected 331 can be determined by observing brightness of portions of the display panel body corresponding to the signal line to be detected 331 and the reference signal line 332. Thus, accuracy of display panel tests can be further increased. Obviously, the sequence of the above-mentioned steps of the test method of the display panel as illustrated in FIG. 10A is only an example, and the sequence of the above-mentioned steps can be changed by requirements of specific implementations. For another example, the steps of the test method of the display panel as illustrated in FIG. 10A can be performed according to the following sequence: step S410, step S440, step S420, step S450, step S430 and step S460-step S499.

Figure 11A:
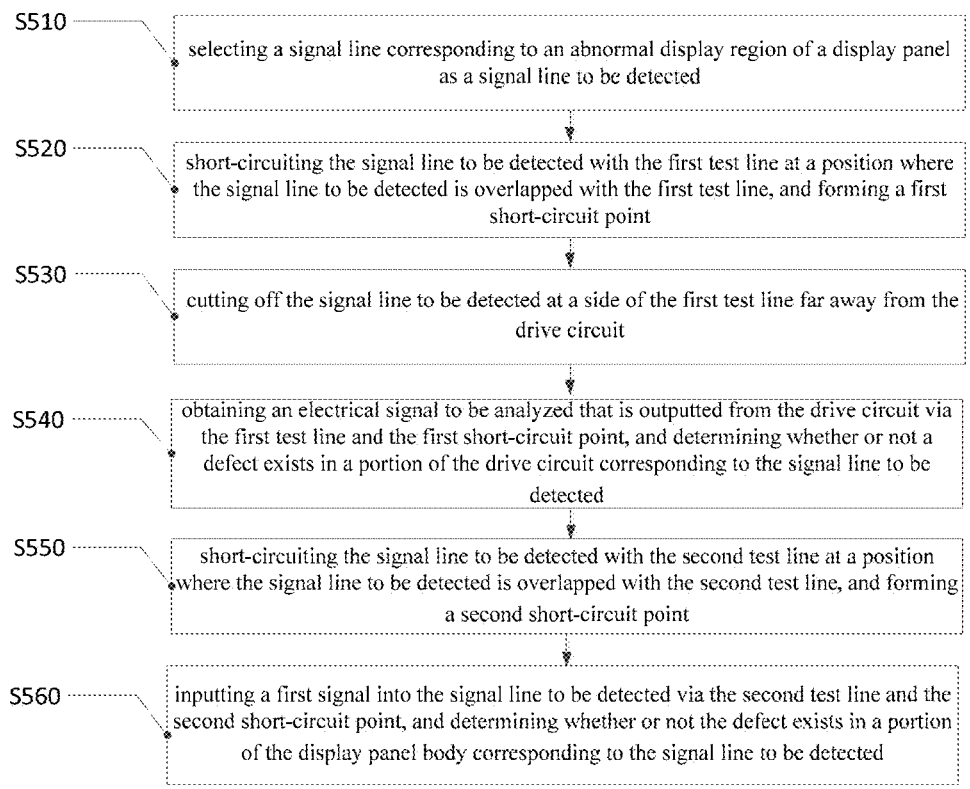
FIG. 11A is an exemplary flow chart of still another test method of a display panel provided by still another embodiment of the disclosure.
Figure 11B:
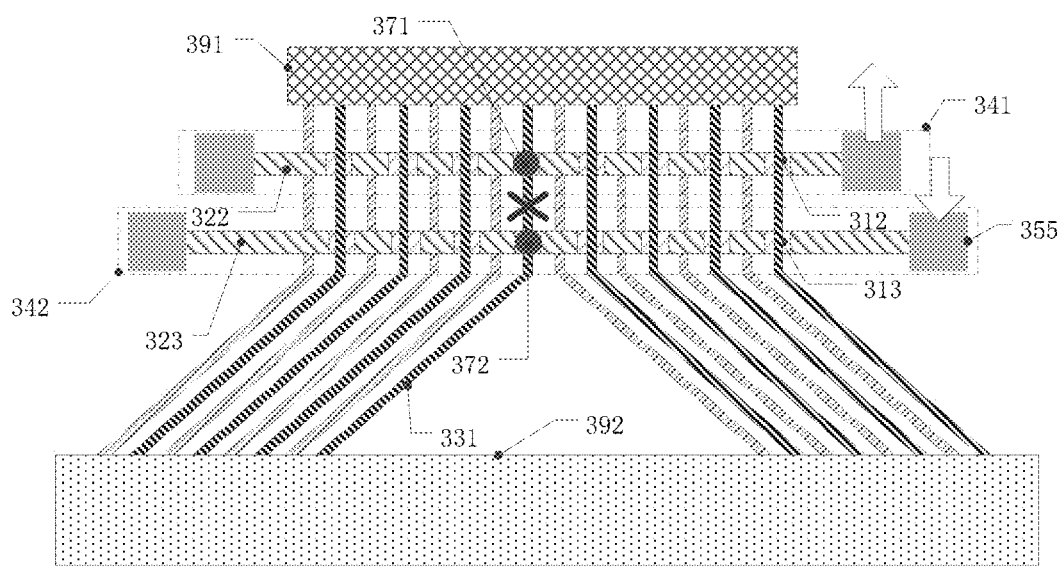
FIG. 11B is a schematic diagram of the test method illustrated in FIG. 11A.

For example, FIG. 11A is an exemplary flow chart of still another test method of a display panel provided by still another disclosure, and FIG. 11B is a schematic diagram of the test method as illustrated in FIG. 11A. As illustrated in FIGS. 11A and 10B, the test method of the display panel can comprises the following steps:

Step S510: selecting a signal line corresponding to an abnormal display area of the display region of a display panel as a signal line to be detected 331;

Step S520: short-circuiting the signal line to be detected 331 with the first test line 341 at a position where the signal line to be detected 331 is overlapped with the first test line 341, and forming a first short-circuit point 371;

Step S530: cutting off the signal line to be detected 331 at a side of the first test line 341 far away from the drive circuit 391;

Step S540: obtaining an electrical signal to be analyzed that is outputted from the drive circuit 391 via the first test line 341 and the first short-circuit point 371, and determining whether or not a defect exists in a portion of the drive circuit 391 corresponding to the signal line to be detected 331;

Step S550: short-circuiting the signal line to be detected 331 with the second test line 342 at a position where the signal line to be detected 331 is overlapped with the second test line 342, and forming a second short-circuit point 372; and Step S560: inputting a first signal into the signal line to be detected 331 via the second test line 342 and the second short-circuit point 372, and determining whether or not the defect exists in a portion of the display panel body corresponding to the signal line to be detected 331.

For example, detailed implementation methods of step S510-step S540 can refer to the step S110 to the step S140, and thus no further descriptions will be given herein. For example, in the step S550, short-circuiting of the signal line to be detected 331 with the second test line 342 can be conducted by laser welding of the signal line to be detected 331 and the second test line 342 at a position where the signal line to be detected 331 is overlapped with the second test line 342. For example, in a case that the signal line to be detected 331 is the first signal line, the first signal line and a corresponding fourth test electrode 323 can be welded together by laser, such that a short-circuit between the first signal line and the second test line 342 can be realized. For another example, in a case that the signal line to be detected 331 is the second signal line, the second signal line and a corresponding third test electrode 313 can be welded together by laser, such that a short-circuit between the second signal line and the second test line 342 can be realized.

For example, in the step S560, a first signal can be inputted into the signal line to be detected 331 via the second test line 342 (for example, a test terminal 355 at a right end of the second test line 342) and the second short-circuit point 372, thereby whether or not the defect exists in the portion of the display panel corresponding to the signal line to be detected 331 can be determined. For example, in a case that the portion of the display panel corresponding to the signal line to be detected 331 still cannot display normally (for example, corresponding pixels cannot emit light or the emitted light of the corresponding pixels have a low brightness) after the first signal being inputted into the signal line to be detected 331 via the second test line 342 and the second short-circuit point 372, it can be determined that the defect exists in the portion of the display panel corresponding to the signal line to be detected 331.

For example, with respect to the test method of the display panel as illustrated in FIGS. 11A and B, for a same signal line to be detected 331, not only whether or not a defect exists in the portion of the drive circuit 391 corresponding to the signal line to be detected 331 can determined by obtaining an electrical signal outputted from the drive circuit 391, but also whether or not a defect exists in the portion of the display panel body corresponding to the signal line to be detected 331 can be determined by inputting the first signal into the signal line to be detected 331, and thus accuracy of display panel tests can be further increased. Obviously, the sequence of the above-mentioned steps of the test method of the display panel as illustrated in FIG. 11A is only an example, i.e., the sequence of the above-mentioned steps can be changed by requirements of specific implementations. For example, whether or not the defect exists in the portion of the display panel body corresponding to the signal line to be detected 331 can be determined at first, and then whether or not the defect exists in the portion of the drive circuit 391 corresponding to the signal line to be detected 331 can be determined.

Figure 12A:
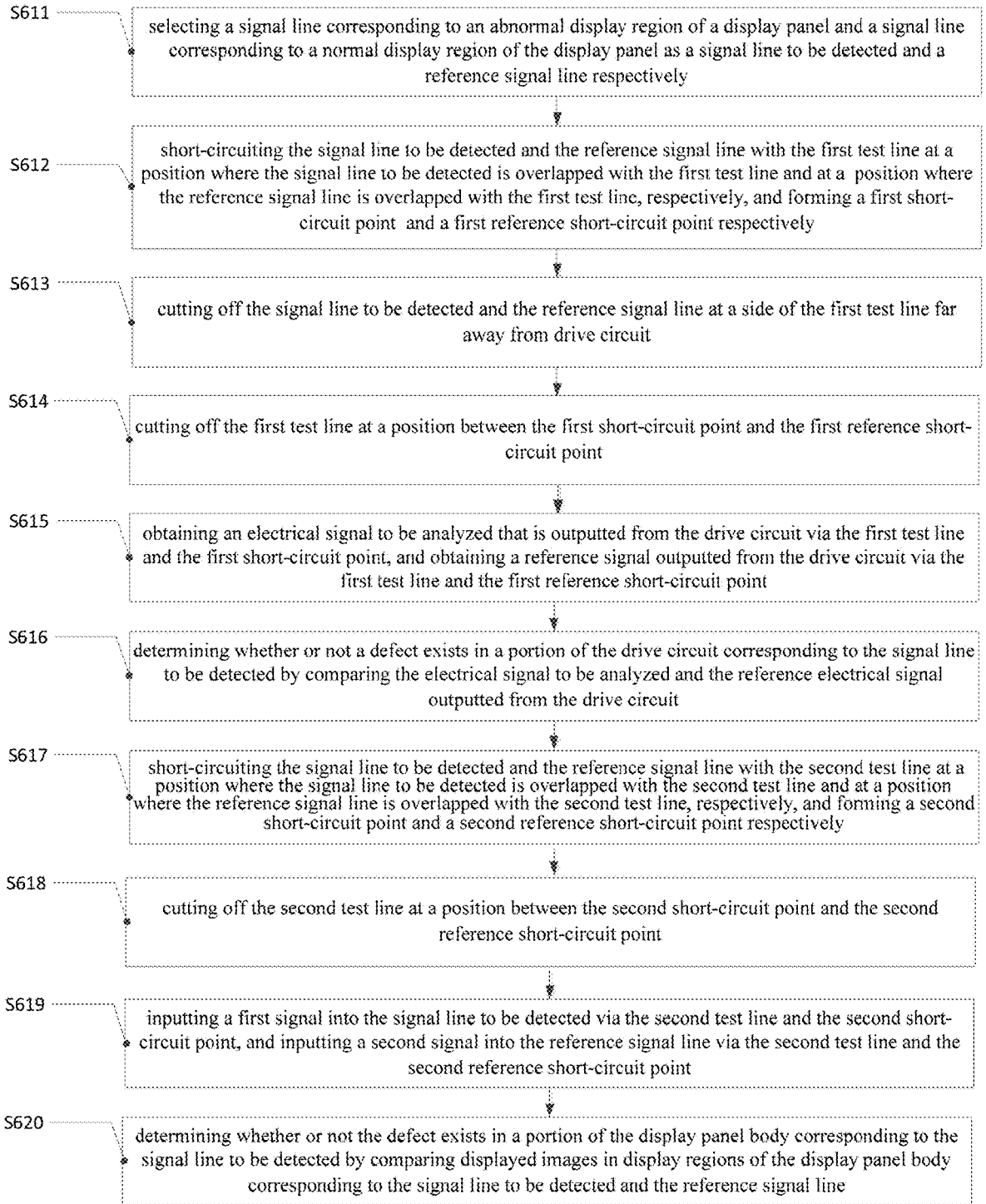
FIG. 12A is an exemplary flow chart of still another test method of a display panel provided by still another embodiment of the disclosure.
Figure 12B:
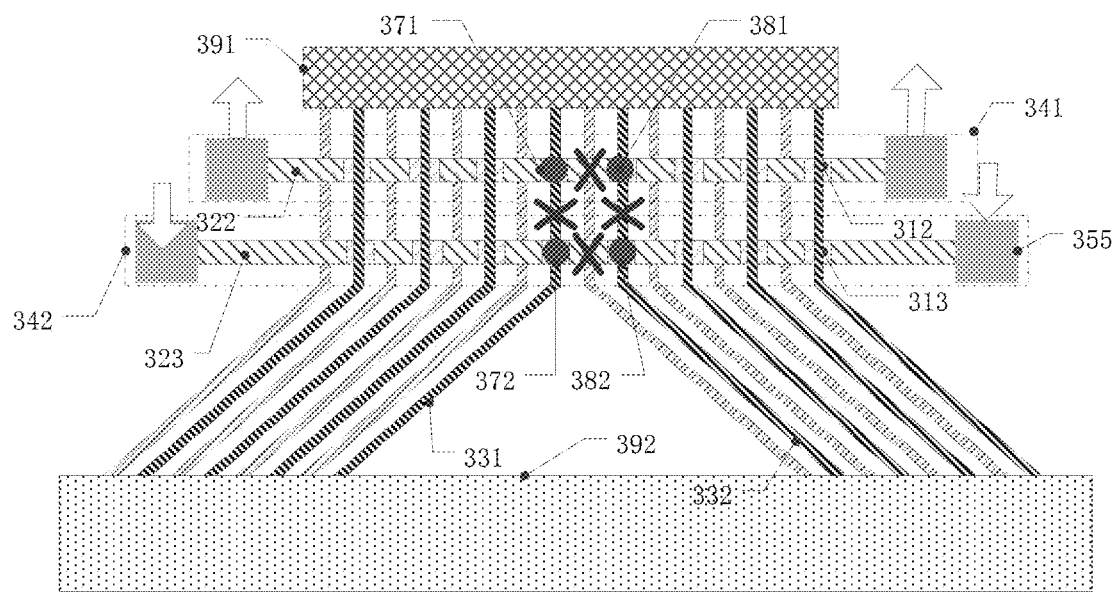
FIG. 12B is a schematic diagram of the test method illustrated in FIG. 12A.

For example, FIG. 12A is an exemplary flow chart of still another test method of a display panel provided by still another disclosure, and FIG. 12B is a schematic diagram of the test method as illustrated in FIG. 12A. As illustrated in FIGS. 12A and 12B, the test method of the display panel can comprises the following steps:

Step S611: selecting a signal line corresponding to an abnormal display area of the display region of a display panel as a signal line to be detected 331 and selecting a signal line corresponding to a normal display area of the display region of the display panel as a reference signal line 332;

Step 612: short-circuiting the signal line to be detected 331 with the first test line 341 at a position where the signal line to be detected 331 is overlapped with the first test line 341 and forming a first short-circuit point 37, and short-circuiting the reference signal line 332 with the first test line 341 at a position where the reference signal line 332 is overlapped with the first test line 341 and forming a first reference short-circuit point 381;

Step S613: cutting off the signal line to be detected 331 and the reference signal line 332 at a side of the first test line 341 far away from a drive circuit 391;

Step S614: cutting off the first test line 341 at a position between the first short-circuit point 371 and the first reference short-circuit point 381;

Step S615: obtaining an electrical signal to be analyzed that is outputted from the drive circuit 391 via the first test line 341 and the first short-circuit point 371, and obtaining a reference signal outputted from the drive circuit 391 via the first test line 341 and the first reference short-circuit point 381;

Step S616: determining whether or not a defect exists in a portion of the drive circuit 391 corresponding to the signal line to be detected 331 by comparing the electrical signal to be analyzed and the reference electrical signal outputted from the drive circuit 391;

Step S617: short-circuiting the signal line to be detected 331 with the second test line 342 at a position where the signal line to be detected 331 is overlapped with the second test line 342 and forming a second short-circuit point 372, and short-circuiting the reference signal line 332 with the second test line 342 at a position where the reference signal line 332 is overlapped with the second test line 342 and forming a second reference short-circuit point 382;

Step S618: cutting off the second test line 342 at a position between the second short-circuit point 372 and the second reference short-circuit point 382;

Step S619: inputting a first signal into the signal line to be detected 331 via the second test line 342 and the second short-circuit point 372, and inputting a second signal into the reference signal line 332 via the second test line 342 and the second reference short-circuit point 382; and Step S620: determining whether or not the defect exists in a portion of the display panel body corresponding to the signal line to be detected 331 by comparing displayed images in display regions of the display panel body corresponding to the signal line to be detected 331 and the reference signal line 332.

For example, detailed implementation methods of the step S611-the step S616 can refer to the steps S310 to the S399, and detailed implementation methods of the step S617-the step S620 can refer to the step 450 and the step S470 to the step S499, and thus no further descriptions will be given herein. For example, with respect to the test method of the display panel as illustrated in FIG. 12, not only whether or not the defect exists in the portion of the drive circuit 391 corresponding to the signal line to be detected 331 can be determined by comparing the electrical signal to be analyzed and the reference electrical signal outputted from the drive circuit 391, but also whether or not the defect exists in the portion of the display panel body corresponding to the signal line to be detected 331 can be determined by comparing displayed images in display regions of the display panel corresponding to the signal line to be detected 331 and the reference signal line 332, and thus accuracy of display panel tests can be further improved by the test method of the display panel as illustrated in FIG. 12. Obviously, the sequence of the above-mentioned steps of the test method of the display panel as illustrated in FIG. 12A is only an example, i.e., the sequence of the above-mentioned steps can be changed by requirements of specific implementations. For example, whether or not the defect exists in the portion of the display panel body corresponding to the signal line to be detected 331 can be determined at first, and then whether or not the defect exists in the portion of the drive circuit 391 corresponding to the signal line to be detected 331 can be determined.

For example, in order to describe the embodiments of the disclosure clearly, scales of structures illustrated in the drawings can be not consistent with scales of structures of actual products. For example, part of the structures illustrated in the drawings can be properly enlarged; for another example, scales of part of the structures illustrated in the drawings can also smaller than scales of corresponding structures of the actual products; that is, the scales of the structures illustrated in the drawings is not intended to illustrated the real scales of the actual structures.

Embodiments of the disclosure provide an array substrate, a display panel and test method thereof and a display device. The array substrate, the display panel and the test method thereof and the display device can improve accuracy of testing of the display panel and/or the display device.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

The application claims priority to the Chinese Patent Application No. 201710202709.3, filed Mar. 30, 2017, the entire disclosure of which is incorporated herein by reference as part of the present application.

What is claimed is:

1. An array substrate including a display region and a peripheral region, the array substrate comprising:
a first electrode layer comprising a plurality of first signal lines arranged along a first direction, wherein the first signal lines extend from the peripheral region to the display region;
a first test line provided in the peripheral region and extending along the first direction, wherein the first test line is overlapped with and insulated from the first signal lines; and
a second electrode layer in a different layer from the first electrode layer and comprising a plurality of second signal lines arranged along the first direction,
wherein the plurality of second signal lines extend from the peripheral region to the display region and are arranged alternately with the plurality of first signal lines, and
the first test line is overlapped with and insulated from the second signal lines.

2. The array substrate of claim 1, wherein the first test line comprises:
a first test electrode provided between two adjacent first signal lines and insulated from the first signal lines; and
a second test electrode provided between two adjacent second signal lines and insulated from the second signal lines,
wherein the first test electrode and the second test electrode are electrically connected to each other to form the first test line.

3. The array substrate of claim 2, further comprising:
a first insulation layer provided between the first electrode layer and the second electrode layer, wherein the first test electrode and the second test electrode are electrically connected to each other through a via hole in the first insulation layer, to form the first test line.

4. The array substrate of claim 3, further comprising a thin film transistor, wherein
the thin film transistor comprises a gate, a gate insulation layer, a source, and a drain;
the first electrode layer is in a same layer as the gate;
the first insulation layer is in a same layer as the gate insulation layer; and
the second electrode layer is in a same layer as the source and the drain.

5. The array substrate of claim 2, further comprising:
a second test line provided in the peripheral region and extending along the first direction, wherein the second test line is overlapped with and insulated from the first signal lines.

6. The array substrate of claim 5, wherein the second test line comprises:
a third test electrode provided between two adjacent first signal lines and insulated from the first signal lines and the first test electrode; and
a fourth test electrode provided between two adjacent second signal lines and insulated from the second signal lines and the second test electrode,
wherein the third test electrode and the fourth test electrode are electrically connected to each other to form the second test line.

7. The array substrate of claim 5, wherein at least one end of the second test line is provided with a test terminal.

8. The array substrate of claim 1, wherein at least one end of the first test line is provided with a test terminal.

9. A display panel, comprising:
the array substrate of claim 1; and
at least one drive circuit,
wherein the at least one drive circuit is electrically connected to the plurality of first signal lines and the plurality of second signal lines and drives the array substrate via the plurality of first signal lines and the plurality of second signal lines.

10. A test method of the display panel of claim 9, comprising:
selecting one of the plurality of first signal lines and the plurality of second signal lines of the display panel as a signal line to be detected;
short-circuiting the signal line to be detected with the first test line at a position where the signal line to be detected is overlapped with the first test line, and forming a first short-circuit point;
cutting off the signal line to be detected at a side of the first test line far away from the at least one drive circuit; and
obtaining an electrical signal to be analyzed that is outputted from a portion of the at least one drive circuit corresponding to the signal line to be detected, via the first test line and the first short-circuit point, and determining whether or not a defect exists in the portion of the at least one drive circuit corresponding to the signal line to be detected.

11. The test method of claim 10, wherein a second test line is provided in the peripheral region and extending along the first direction, wherein the second test line is overlapped with and insulated from the first signal lines, the method further comprising:
short-circuiting the signal line to be detected with the second test line at a position where the signal line to be detected is overlapped with the second test line, and forming a second short-circuit point; and
inputting a first signal into the signal line to be detected via the second test line and the second short-circuit point, and determining whether or not the defect exists in a portion of a display panel body corresponding to the signal line to be detected.

12. The test method of claim 11, further comprising:
selecting a signal line corresponding to a normal display area of the display region of the display panel from the plurality of first signal lines and the plurality of second signal lines as a reference signal line;
short-circuiting the reference signal line with the first test line at a position where the reference signal line is overlapped with the first test line, and forming a first reference short-circuit point;
cutting off the reference signal line at the side of the first test line far away from the at least one drive circuit;
cutting off the first test line at a position between the first short-circuit point and the first reference short-circuit point;
obtaining a reference electrical signal outputted from a portion of the at least one drive circuit corresponding to the reference signal line, via the first test line and the first reference short-circuit point; and determining whether or not the defect exists in the portion of the at least one drive circuit corresponding to the signal line to be detected by comparing the electrical signal to be analyzed and the reference electrical signal outputted from the at least one drive circuit.

13. The test method of claim 12, further comprising:

short-circuiting the reference signal line with the second test line at a position where the reference signal line is overlapped with the second test line, and forming a second reference short-circuit point; and inputting a second signal into the reference signal line via the second test line and the second reference short-circuit point, and determining whether or not the defect exists in the portion of the display panel body corresponding to the signal line to be detected by comparing displayed images in display regions of the display panel body corresponding to the signal line to be detected and the reference signal line.

14. The test method of claim 10, further comprising:

selecting a signal line corresponding to a normal display area of the display region of the display panel from the plurality of first signal lines and the plurality of second signal lines as a reference signal line;

short-circuiting the reference signal line with the first test line at a position where the reference signal line is overlapped with the first test line, and forming a first reference short-circuit point;

cutting off the reference signal line at the side of the first test line far away from the at least one drive circuit;

cutting off the first test line at a position between the first short-circuit point and the first reference short-circuit point;

obtaining a reference electrical signal outputted from a portion of the at least one drive circuit corresponding to the reference signal line, via the first test line and the first reference short-circuit point; and determining whether or not the defect exists in the portion of the at least one drive circuit corresponding to the signal line to be detected by comparing the electrical signal to be analyzed and the reference electrical signal outputted from the at least one drive circuit.

15. The test method of claim 10, wherein the short-circuiting of the signal line to be detected with the first test line is conducted by laser welding of the signal line to be detected and the first test line.

16. The test method of claim 15, wherein the cutting off the signal line to be detected and/or the first test line is conducted by laser cutting.

17. A test method of the display panel of claim 9, comprising:

selecting one of the plurality of first signal lines and the plurality of second signal lines of the display panel as a signal line to be detected;

short-circuiting the signal line to be detected with the first test line at a position where the signal line to be detected is overlapped with the first test line, and forming a first short-circuit point;

cutting off the signal line to be detected at a side of the first test line far away from an array substrate body; and inputting a first signal into the signal line to be detected, via the first test line and the first short-circuit point, and determining whether or not a defect exists in a portion of a display panel body corresponding to the signal line to be detected.

18. The test method of claim 17, further comprising:

selecting a signal line corresponding to a normal display area of the display region of the display panel from the plurality of first signal lines and the plurality of second signal lines as a reference signal line;

short-circuiting the reference signal line with the first test line at a position where the reference signal line is overlapped with the first test line, and forming a first reference short-circuit point;

cutting off the reference signal line at the side of the first test line far away from the array substrate body;

cutting off the first test line at a position between the first short-circuit point and the first reference short-circuit point; and inputting a second signal into the reference signal line, via the first test line and the first reference short-circuit point, and determining whether or not the defect exists in the portion of the display panel body corresponding to the signal line to be detected by comparing displayed images in display regions of the display panel body corresponding to the signal line to be detected and the reference signal line.

19. A display device, comprising a display panel, wherein the display panel comprises an array substrate and at least one drive circuit, wherein the at least one drive circuit is electrically connected to a plurality of first signal lines and a plurality of second signal lines of the array substrate and drives the array substrate via the plurality of first signal lines and the plurality of second signal lines, wherein the array substrate comprises a display region and a peripheral region, and the array substrate comprises:

a first electrode layer comprising the plurality of first signal lines arranged along a first direction, wherein the first signal lines extend from the peripheral region to the display region;

a first test line provided in the peripheral region and extending along the first direction, wherein the first test line is overlapped with and insulated from the first signal lines; and a second electrode layer in a different layer from the first electrode layer and comprising the plurality of second signal lines arranged along the first direction, wherein the plurality of second signal lines extend from the peripheral region to the display region and are arranged alternately with the plurality of first signal lines, and the first test line is overlapped with and insulated from the second signal lines.

\* \* \* \* \*